(12) United States Patent
Hata et al.

(10) Patent No.: US 6,227,755 B1
(45) Date of Patent: May 8, 2001

(54) PARTS SUPPLY DEVICE AND FIXING DEVICE THEREFOR

(75) Inventors: Kanji Hata, Katano; Shiro Oji, Osaka; Masahiro Morimoto, Hirakata; Shigetoshi Negishi, Suita, all of (JP)

(73) Assignee: Matsushita Electric Industrial Co., Ltd., Osaka-Fu (JP)

( * ) Notice: Subject to any disclaimer, the term of this patent is extended or adjusted under 35 U.S.C. 154(b) by 0 days.

(21) Appl. No.: 09/285,177

(22) Filed: Mar. 23, 1999

(30) Foreign Application Priority Data

Mar. 31, 1998 (JP) .................................................. 10-086960

(51) Int. Cl.[7] ...................................................... F16B 21/00
(52) U.S. Cl. .................. 403/322.1; 403/325; 403/322.3; 403/322.4; 403/13
(58) Field of Search ................................. 403/322.1, 321, 403/325, 322.3, 322.4, 323, 6, 13, 14; 292/DIG. 49, 99, 102, 198, 203

(56) References Cited

U.S. PATENT DOCUMENTS

| | | | |
|---|---|---|---|
| 4,159,137 | * 6/1979 | Richter | 292/123 |
| 4,230,351 | * 10/1980 | Bisbing | 292/223 |
| 4,632,595 | * 12/1986 | Schaeff | 403/330 |
| 4,750,238 | * 6/1988 | Rock et al. | 16/241 |
| 5,040,915 | * 8/1991 | Stuart et al. | 403/322 |
| 5,060,492 | * 10/1991 | Carpenter et al. | 70/73 |
| 5,208,735 | * 5/1993 | Twachtmann et al. | 361/391 |
| 5,461,892 | * 10/1995 | Hsieh | 70/73 |

* cited by examiner

Primary Examiner—Lynne H. Browne
Assistant Examiner—John B. Walsh
(74) Attorney, Agent, or Firm—Price and Gess (57) ABSTRACT

At the front end side of parts supply device 8, an engagement part 22 is provided that is fixed in the vertical and left/right direction by engagement with an abutment part 23 that is provided on the side of a parts supply table 7; and at the rear end side of parts supply device 8 a fixing shaft 28 in the horizontal direction is provided. In parts supply table 7, there is provided a toggle link mechanism having an abutment link 31 that can be rocked in the vertical direction, that is formed at its free end 31a with an engagement groove 32, which can be fitted into and engaged by this fixing shaft 28. The toggle link mechanism is so arranged that it biases the abutment link 31 towards two positions: an attitude in which this engagement groove 32 is directed upwardly, and an attitude in which it is horizontal or directed downwardly.

11 Claims, 8 Drawing Sheets

PARTS SUPPLY DEVICE AND FIXING DEVICE THEREFOR

BACKGROUND OF THE INVENTION

1. Field of the Invention

In a parts installation device or the like whereby parts such as electronic components are installed on a circuit board, the present invention relates to a fixing device for a parts supply device whereby the parts supply device can be mounted on the parts supply table by a "one-touch" operation.

2. Description of the Related Art

Figure 9:
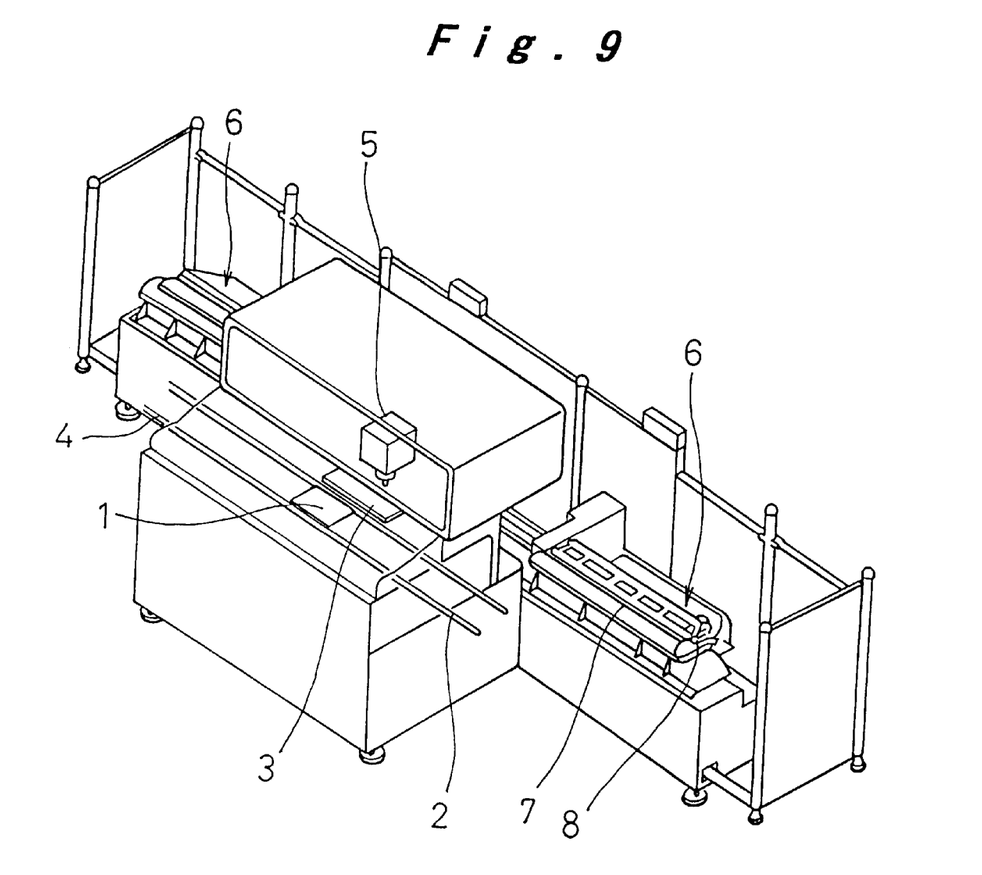
FIG. 9 is a perspective view of an entire electronic component installation device.

A known conventional electronic components installation device has a construction for example as shown in FIG. 9. In FIG. 9, 1 is a circuit board on which the electronic components are to be installed, 2 is a circuit board intake unit, 3 is an XY table for positional location of a circuit board 1 in an installation position, and 4 is a circuit board discharge unit. 5 is an installation head that installs electronic components onto circuit board 1, and 6 is a parts supply unit that supplies electronic components that may be selected at will to installation head 5; the construction is such that a large number of parts supply devices 8 are mounted on a supply table 7 that can be displaced in the left/right direction, aligned in the direction of displacement.

A circuit board 1 is fed in by circuit board intake unit 2 and fixed on XY table 3 and located in a prescribed position on XY table 3. Simultaneously, supply table 7 of parts supply unit 6 is displaced such that a parts supply device 8 holding the desired electronic components faces installation head 5, and an electronic component is extracted by installation head 5 from parts supply device 8 and installed on circuit board 1.

Figure 10:
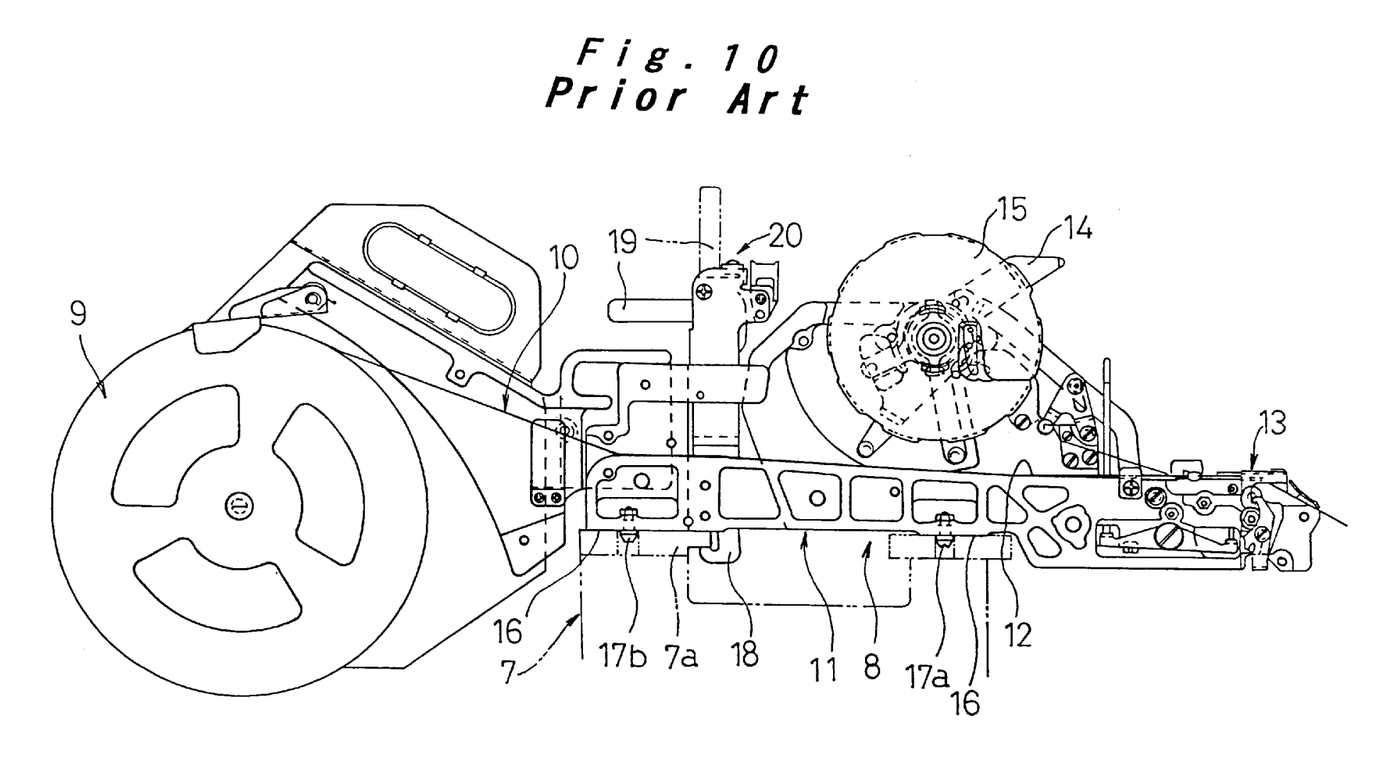
FIG. 10 is a front view of a parts supply device according to the prior art.

A constructional example of parts supply device 8 will now be described with reference to FIG. 10. A running guide surface 12 is provided on the upper face of body 11, and a parts extraction unit 13 is arranged at its leading end. A reel 9 on which is wound a tape carrier 10 carrying a large number of electronic components can be fitted at the rear of body 11, so that this tape carrier 10 can be pulled out over running guide surface 12. 14 is a depression lever for pitch feed; by depressing this, tape carrier 10 is pitch-fed by a pitch-feed mechanism (not shown) arranged at the front end of body 11. Simultaneously, a top tape covering the upper surface of tape carrier 10 is peeled off and is wound up on to top tape take-up reel 15.

An installation surface 16 for supply table 7 is provided at the bottom face of body 11, with position locating pins 17a, 17b projecting at its front and rear. Also, body 11 is provided with a clamping device 20 whereby an installation plate 7a on the side of supply table 7 is clamped and fixed. Clamping device 20 is constructed such that it fixes parts supply device 8 on supply table 7 with installation plate 7a clamped by hook 18 and installation surface 16, by rotation of an operation lever 19 at its top from the upright position shown by the dotted line into the horizontal position shown by the solid line.

However, there was the problem of poor operating characteristics since, when mounting the above conventional parts supply device 8 on supply table 7, it was necessary to fit the pair of positional location pins 17a, 17b projecting from installation surface 16 in positional location holes formed in installation plate 7a on the side of supply table 7 before operating operation lever 19 of clamping device 20. Time was thus required for mounting of parts supply device 8 since a further operation of operation lever 19 was necessary.

SUMMARY OF THE INVENTION

With the foregoing in view, it is an object of the present invention to provide a fixing device for a parts supply device of good operating characteristics and wherein the parts supply device can be mounted with respect to the supply table by a "one-touch" operation.

A parts supply device according to the present invention is mounted on a parts supply table and constructed to be capable of supplying parts to a prescribed position, and comprises: an engagement part provided at a front end side that is fixed by engagement, by displacement in forwards/rearwards direction of the parts supply device, with an abutment part that is provided on the side of the parts supply table; and a fixing shaft provided at a rear end side, wherein on the side of the parts supply table there is provided a toggle link mechanism type fixing means comprising an abutment link that can be rocked in a vertical direction, that is formed at its free end with an engagement groove, and that is biased towards two positions: an attitude in which this engagement groove is directed upwardly, and an attitude in which it is horizontal or directed downwardly, provided on the side of the parts supply table, and the fixing shaft of he parts supply device is constructed to be capable of fitting into and engage said engagement groove of the toggle ink mechanism type fixing means.

Further, a fixing device for the parts supply device according to the present invention comprises: an engagement part provided at a front end side of the parts supply device, that is fixed in vertical and left/right directions by engagement, by displacement in forwards/rearwards direction, with an abutment part provided on the side of the parts supply table; a fixing shaft provided in a horizontal direction at a rear end side of the parts supply device; and, a toggle link mechanism type fixing means provided on the side of the parts supply table comprising an abutment link that is capable of vertical rocking and that is formed at its free end with an engagement groove into which this fixing shaft fits and engages, the arrangement being such that the abutment link is biased towards two positions: an attitude in which this engagement groove is directed upwardly and an attitude in which it is horizontal or directed downwardly.

According to the present invention, the abutment lever rocks such that the engagement groove is horizontal or directed downwards after the fixing shaft has been made to fit into and engage the engagement groove of the abutment link by depressing the rear end side on engagement of the engagement part of the front end side of the parts supply device with the abutment part, and this condition is maintained by strong downwards biasing by the toggle link mechanism.

A slot is formed in a shaft support part of the abutment link that is capable of rocking movement, the parts supply device being biased in the forwards/rearwards direction by means for biasing of the toggle link mechanism, the arrangement being such that the engagement part is pressed onto the abutment part in the forwards/rearwards direction. The engagement part can be thus pressed onto the abutment part by utilizing the means for biasing of the toggle link mechanism, thereby making it possible for the parts supply device to be precisely located in position in the forwards/rearwards direction.

The toggle link mechanism type fixing means comprises an abutment link, an operating link whereof one end is pivoted at the opposite end of the abutment link to that of the engagement groove, a bracket comprising a first shaft support part that supports an intermediate part of the abutment link and a second shaft support part that supports the other end of the operating link freely slidably in the longitudinal direction thereof, and a compression spring that is interposed between the leading end of the operating link and the second support shaft part, whereby the desired action can be reliably obtained by a straightforward construction.

Furthermore, precision of positional location of the parts supply device can be ensured by providing a restraining pin which depends at the front or rear of the toggle link mechanism type fixing means and a position locating part which the restraining pin engages provided on the parts supply table.

If the restraining pin depends for a long distance such that engagement of the restraining pin with the position locating part is commenced before the fixing shaft fits into the engagement groove of the abutment link, the restraining pin also provides the action of a guide, enabling preventing movement of the abutment link due to some part other than the fixing shaft abutting the abutment link to be prevented and so enabling the fixing shaft to be fitted into and engaged in the engagement groove in a reliable manner.

Also, if the position locating part is formed such that at least the root end and tip of the restraining pin engage therewith, tipping over of the parts supply device in the direction of displacement of the supply table can be reliably prevented.

The leading end of the abutment part on the side of the parts supply table is constituted by an engagement plate formed with a tapered or arcuate leading end cross-section, the engagement part on the parts supply device side is constituted by a hook member provided with a downwardly directed hook part, and the abutment link of the toggle link mechanism type fixing means is arranged at the rear side. Positional location and fixing of the parts supply device can be thereby achieved with an operationally easy "one-touch" action, by displacing the parts supply device with its front part directed downwards in slanting fashion and, at a position where the engagement part has passed the abutment part, lowering the parts supply device and pulling it forwards, thereby causing the engagement part to engage the abutment part, and depressing the rear of the parts supply device in this engaged condition.

If the abutment part on the parts supply table side is constituted by a hook member provided with an upwardly directed hook part, the leading end of the engagement part on the side of the parts supply device is constituted by an engagement member formed with a tapered or arcuate leading end cross-section, and the abutment link of the toggle link mechanism type fixing means is arranged at the front side, by displacing the parts supply device with its front part directed downwards in slanting fashion and causing the engagement part to engage the abutment part, and depressing the rear of the parts supply device in this engaged condition, positional location and fixing of the parts supply device can be achieved with an operationally easy "one-touch" action.

In the above construction, of the first shaft support part that supports the intermediate part of the abutment link, the front end of the upper edge thereof is made to face the aperture edge of the engagement groove of the abutment link when in upwardly directed attitude and the rear end thereof is made to extend further rearwards than the rear end of the abutment link, by which when the fixing shaft or its bracket is displaced forwards, the risk of the toggle link mechanism being accidentally actuated by abutment of the fixing shaft with the abutment link before fitting into the engagement groove can be eliminated.

A position locating pin projects from one of the abutment plate and hook member, an engagement groove with which the position locating pin engages being formed in the other one, or a position locating pin projects from one of the hook member and engagement member, an engagement groove with which the position locating pin engages being formed in the other one, by which more precise left-right positional control at the front end can be achieved by the position locating pin and engagement groove.

Also, if a rib and groove that fit into and engage each other are provided in the forwards/rearwards direction instead of the position locating pin and engagement groove, the same effect can be achieved.

Furthermore, the free end of the abutment link that is formed with the engagement groove is smaller in thickness than the plate thickness of the shaft support part, accidental actuation by abutment of members around the periphery of the fixing shaft, such as the bracket on which the fixing shaft is mounted, with the free end of the abutment link can be prevented.

DESCRIPTION OF THE PREFERRED EMBODIMENTS

An embodiment of a fixing device for a parts supply device according to the present invention is described below with reference to FIG. 1~FIG. 5. The construction of the parts supply device and electronic components installation device on which this is mounted are essentially the same as in the prior art example described with reference to FIG. 9 and FIG. 10, so identical structural elements are given the same reference numerals and further description thereof is omitted.

Figure 1A:
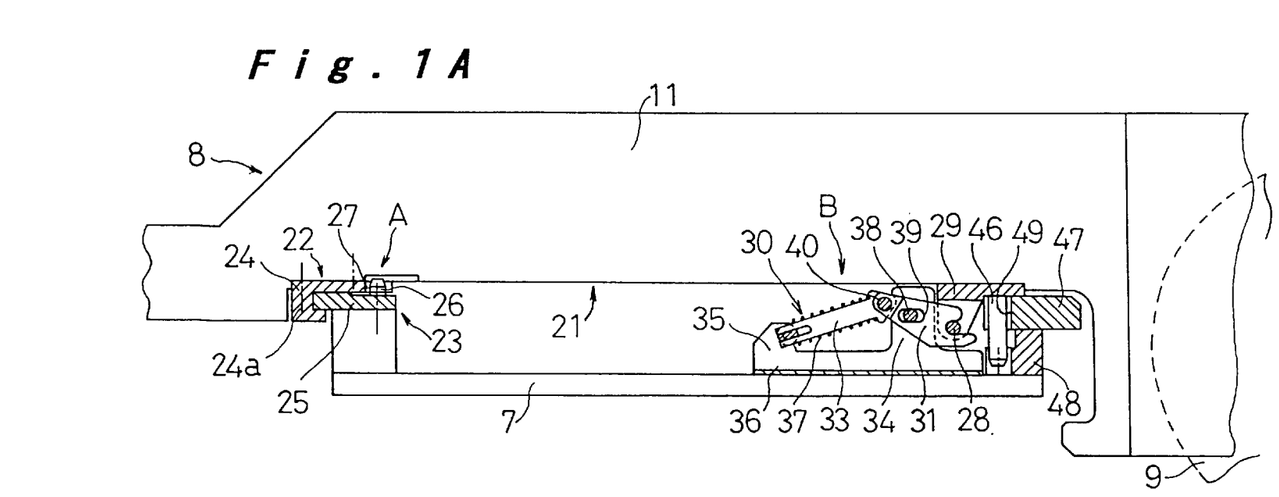
FIG. 1A is a partial cross-sectional front view of the condition in which mounting is effected, showing the construction of major parts in an embodiment of a fixing device for a parts supply device according to the present invention
Figure 1B:
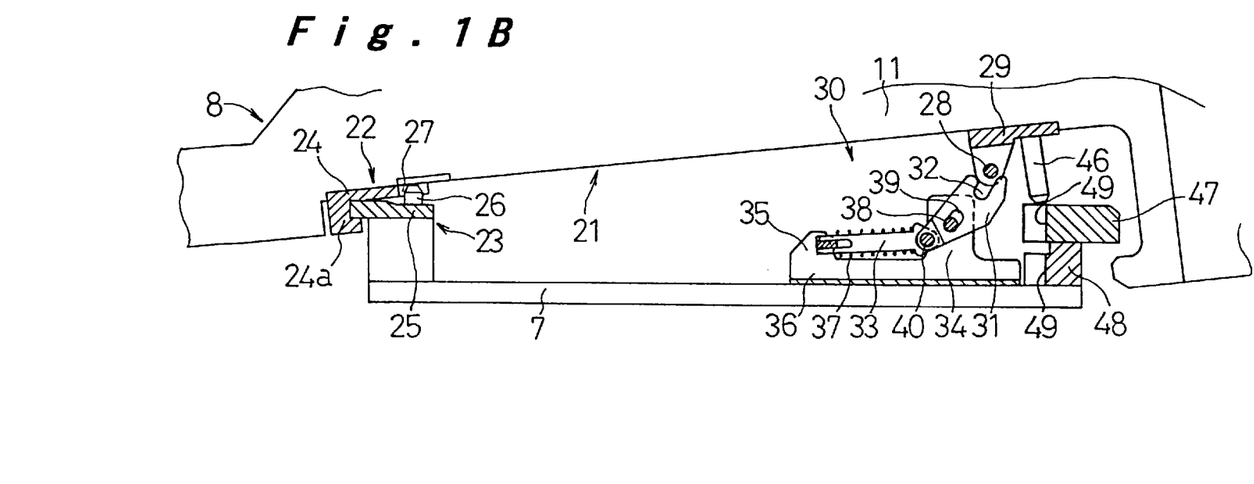
FIG. 1B is a partial cross-sectional front view showing the condition immediately prior to this mounting.

In FIG. 1, 11 is the body of components supply device 8; at its front end there is arranged a mechanism (not shown) for effecting pitch feed of a tape carrier, and at its rear there can be fitted a reel 9 on which is wound the tape carrier. An installation part 21 with respect to supply table 7 is provided on the bottom surface of an intermediate part in the forwards/rearwards direction of this body 11. As described in connection with the prior art example, supply table 7 can be displaced to left and right, and a large number of parts supply devices 8 are mounted arranged parallel to this direction of displacement on this supply table 7.

Figure 2:
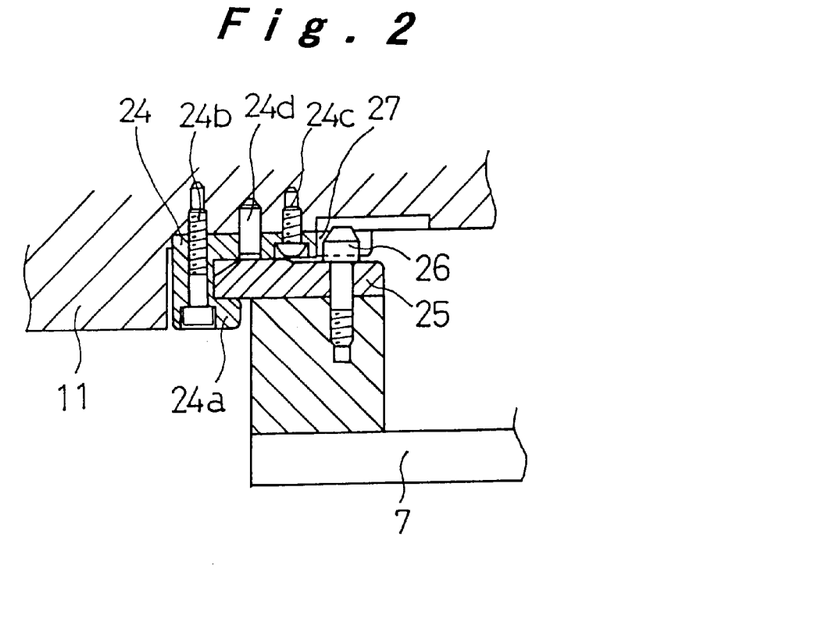
FIG. 2 is a cross-sectional view to a larger scale of a detail A of FIG. 1.

An engagement part 22 is provided at the front end of installation part 21, and an abutment part 23 that is capable of being engaged by this engagement part 22 is arranged at an opposite position of supply table 7. As shown in detail in FIG. 2, engagement part 22 is constituted by a hook member 24 provided with a downwardly-directed hook part 24a, and abutment part 23 is constituted by an abutment plate 25 whose front end is capable of being engaged by hook part 24a of this hook member 24. Abutment plate 25 has its upper front end surface cut in tapered fashion so that hook member 24 can smoothly engage therewith even when this is in a slanting attitude, and its thickness is prescribed such that only this front end accurately coincides with the aperture width of hook part 24a of hook member 24. Positional location and fixing can be effected not only accurately and smoothly but also economically, as the area in respect of which precision is required is small. A positional location pin 26 projects from the upper face of the rear part of abutment plate 25, and an engagement groove 27 in which this positional location pin 26 can fit and engage is formed in the rear part of hook member 24. Positional location and fixing in the vertical direction and left/right direction of installation part 21 is effected by engagement of this hook part 24 and abutment plate 25, and positional location pin 26 and engagement groove 27. In FIG. 2, 24b and 24c are mounting screws, and 24d is a knock bolt for positional location. Positional location pin 26 also serves as a fixing screw of abutment plate 25.

At the rear end of installation part 21, there is arranged a fixing shaft 28 having a horizontal axis, by means of a mounting bracket 29. Toggle link mechanism-type fixing means 30 that fixes this fixing shaft 28 is arranged in a position facing supply table 7. This toggle link mechanism type fixing means 30 is provided with an abutment link 31 capable of rocking vertically formed at its free or contilevered end with an engagement groove 32 in which fixing shaft 28 can fit and engage; the construction is such that abutment link 31 is powerfully biased towards either of two positions: an upwardly directed attitude in which this engagement groove 32 accommodates the fixing shaft 28, and a horizontal or downwardly directed attitude in which fixing shaft 28 is fixed.

Figure 3:
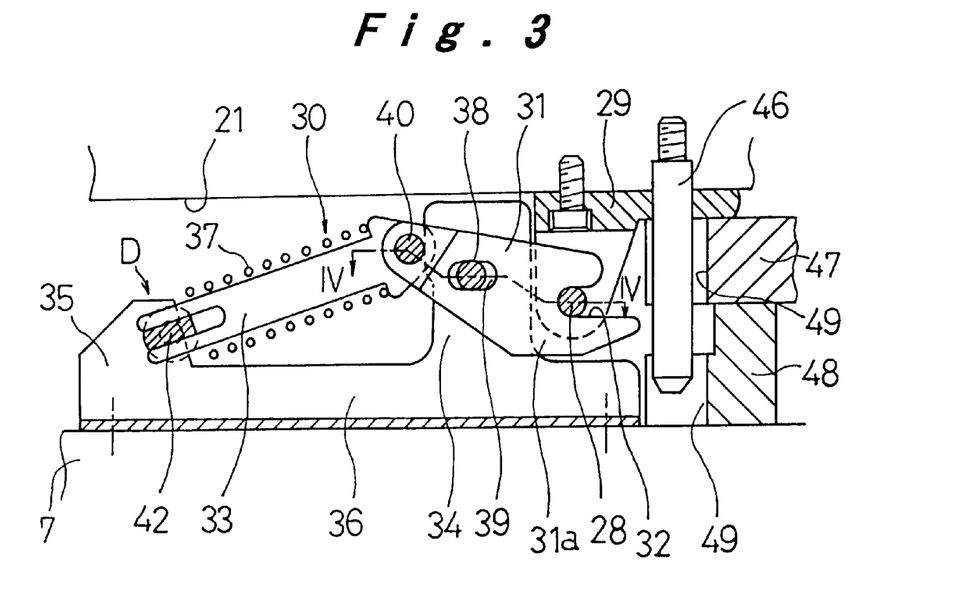
FIG. 3 is a cross-sectional view to a larger scale of a detail B of FIG. 1.

As shown in detail in FIG. 3, toggle link mechanism type fixing means 30 is constituted of: the aforementioned abutment link 31, an operating link 33 whereof one end is pivoted at the end of abutment link 31 on the opposite side to engagement groove 32; a bracket 36 provided with a first shaft support part 34 that supports an intermediate part of abutment link 31 and a second shaft support part 35 that supports the other end of operating link 33 such that it is slidable in its longitudinal direction; and a compression spring 37 which is mounted between the tip of operating link 33 and second shaft support part 35.

Figure 4:
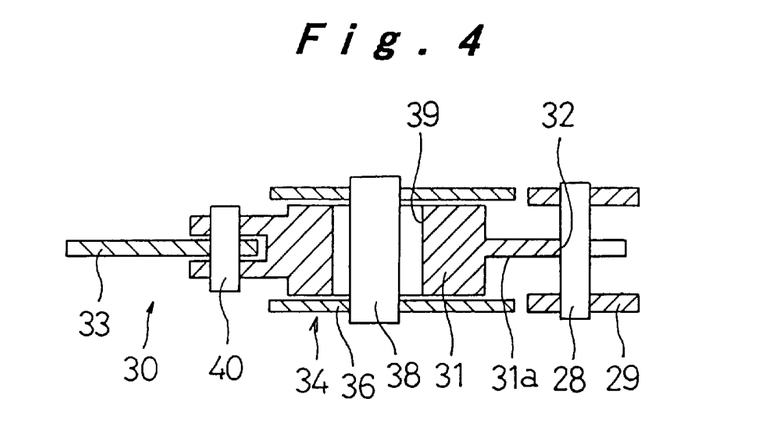
FIG. 4 is a cross-sectional view seen in the direction of arrows IV—IV of FIG. 3.

As shown in FIG. 4, in the first shaft support part 34, a slot 39 formed in the intermediate section of abutment link 31 has fitted into it a support shaft 38 fixed to bracket 36, and abutment link 31 is biased for displacement through operating link 33 by compression spring 37, the construction being such that fixing shaft 28 engaged by engagement groove 32 is biased for rearwards displacement. In this way, engagement part 22 is pushed in the rearwards direction towards abutment part 23 and positional location in the forwards/rearwards direction is thereby effected. In FIG. 4, 40 is a connecting pin of abutment link 31 and operating link 33. Also, free end 31a of abutment link 31 that is provided with engagement groove 32 is formed thinner than the thickness of the shaft support part of abutment link 31. Accidental actuation by abutment of mounting bracket 29 etc. of fixing shaft 28 with the free end of abutment link 31 is thereby prevented.

Figure 5:
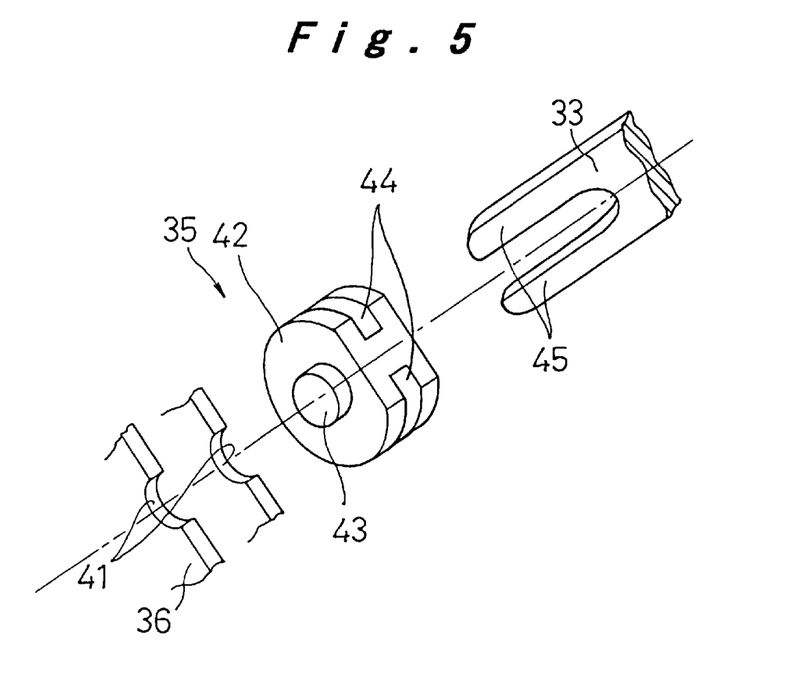
FIG. 5 is an exploded perspective view of a detail D of FIG. 3.

As shown in FIG. 5, in the second shaft support part 35, U-shaped grooves 41 are formed on bracket 36 and there is provided a convex shaft part 43 that freely rotatably fits in these U-shaped grooves 41 on both sides. A rotary support member 42 is formed with a pair of radially opposite parallel grooves 44 in its circumference and a fork 45 formed at the other end of actuating link 33 is freely slidably fitted in these parallel grooves 44. The other end of actuating link 33 is thereby supported in such a way that it is free to rotate on second shaft support part 35 while extending/retracting.

In FIG. 1 and FIG. 3, a restraining pin 46 depends from the rear of mounting bracket 29. On receiving plate 47 that receives the rear part of mounting bracket 29 provided on the side of supply table 7 and its support bracket 48, there is formed a position locating groove 49 for left/right positional location of parts supply device 8 by engagement with this restraining pin 46. Also, restraining pin 46 depends a long way such that its tip starts to engage position locating groove 49 before fixing shaft 28 fits into engagement groove 32 of abutment link 31; thus, the construction is such that fixing shaft 28 functions as a guide on engagement of abutment link 31 in engagement groove 32, and furthermore, in a condition in which parts supply device 8 is installed, there is provided a function whereby it is prevented from tipping over in the left or right directions. To this end, receiving plate 47 and its support bracket 48 are formed such that position locating groove 49 engages at least the root end and tip of restraining pin 46. It is also possible to arrange restraining pin 46 at the front of toggle link mechanism type fixing means 30.

In the above construction, the front of parts supply device 8 is directed slantingly downwards and moved forward over the supply table 7, and by pulling parts supply device 8 downwards and forwards at a position where hook member 24 has passed abutment plate 25, hook member 24 is made to engage abutment plate 25. Then, in this condition, by pressing the rear part of parts supply device 8 downwards, fixing shaft 28 is fitted into and engaged with the interior of engagement groove 32 of abutment link 31 of toggle link mechanism type fixing means 30, in a condition with restraining pin 46 being guided by being fitted into and engaging with position locating groove 49. Thus, abutment link 31 is rotated towards an attitude in which engagement groove 32 is directed horizontally or downwards, against the biasing force of compression spring 37 and, in this attitude, is powerfully fixed by the biasing force of compression spring 37 and the toggle link mechanism. In this way, parts supply device 8 can be rotated into position and fixed by an easy, "one-touch" operation. Also, the effect is presented that the restraining pin 46 acts as a guide when the rear part of parts supply device 8 is depressed, preventing movement of abutment link 31 due to some part other than fixing shaft 28 abutting abutment link 31. In this way, fixing shaft 28 can be reliably fitted into and engage the interior of engagement groove 32. Also, accurate positional location of parts supply device 8 in the rearwards direction can be achieved since, in the fixed condition of parts supply device 8, hook member 24 is pressed against abutment plate 25 by rearwards biasing of parts supply device 8 by the biasing force of compression spring 37 of the toggle link mechanism. Also, since the root end and tip of restraining pin 46 engage positional location groove 49, positional location accuracy at the rear of parts supply device 8 can be ensured and tipping over of parts supply device 8 in the direction of displacement of the supply table 7 can be reliably prevented.

Also, since this toggle link mechanism type fixing means 30 has a straightforward construction comprising abutment link 31, operating link 33, bracket 36 provided with first shaft support part 34 and second shaft support part 35, and compression spring 37, it can be manufactured at low cost.

Figures 6A, 6B:
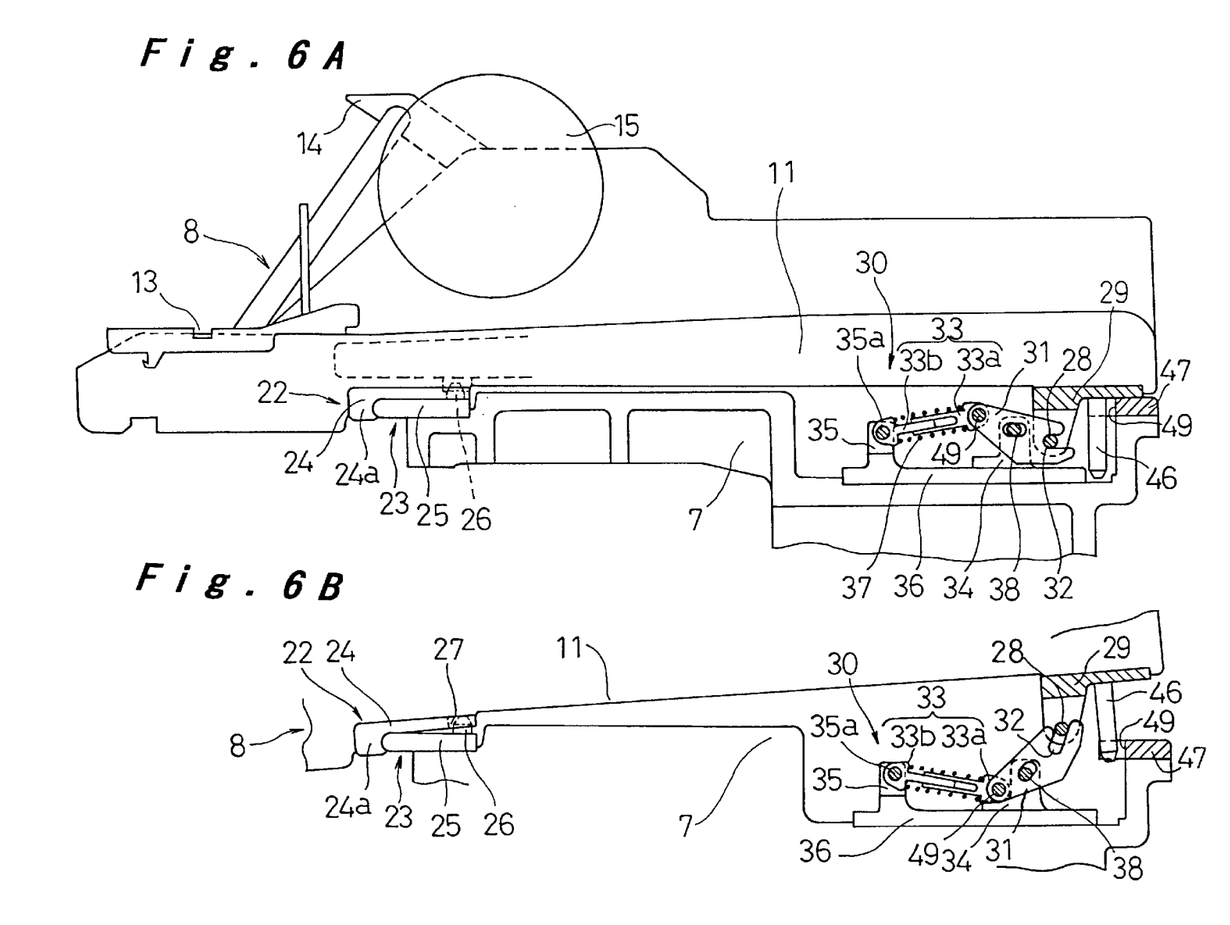
FIG. 6A is a partially sectioned front view of the condition in which mounting is effected, showing the construction of major parts according to another embodiment of a fixing device for a parts supply device according to the present invention.
FIG. 6B is a partially sectioned front view showing the condition immediately prior to this mounting.

Next, a further embodiment of a fixing device for a parts supply device according to the present invention is described with reference to FIG. 6. Structural elements which are identical with those in the preceding embodiment are given the same reference numerals and further description thereof is omitted, only the points of difference being described.

In this embodiment, the cross-sectional shape of supply table 7 is somewhat different, but its action is unchanged. The inside face of hook part 24a of hook member 24 that constitutes engagement part 22 is of arcuate cross-section and the leading end of abutment plate 25 corresponding thereto is also formed of arcuate cross-section. Operating link 33 is constituted by a first link 33a and second link 33b which are telescopically fitted into each other such that they are free to extend and retract, one end of first link 33a being connected to abutment link 31, while the other end of second link 33b is pivotally supported by support shaft 35a on second shaft support part 35 of bracket 36. The position locating groove 49 that is engaged by restraining pin 46 is provided only on receiving plate 47. In FIG. 6, 13 is a component extraction unit, 14 is a depressing lever, and 15 is a top tape take-up reel. This embodiment has the same action as in the case of the embodiment described above apart from the fact that the tipping-over preventing function of parts supply device 8 is less.

It should be noted that, although in the above embodiment an example was illustrated in which position locating pin 26 was provided on the abutment part 23 on the side of supply table 7 and engagement groove 27 was provided in engagement part 22 on the side of parts supply device 8, the same effect could be obtained by reversing this arrangement.

Figures 7A, 7B:
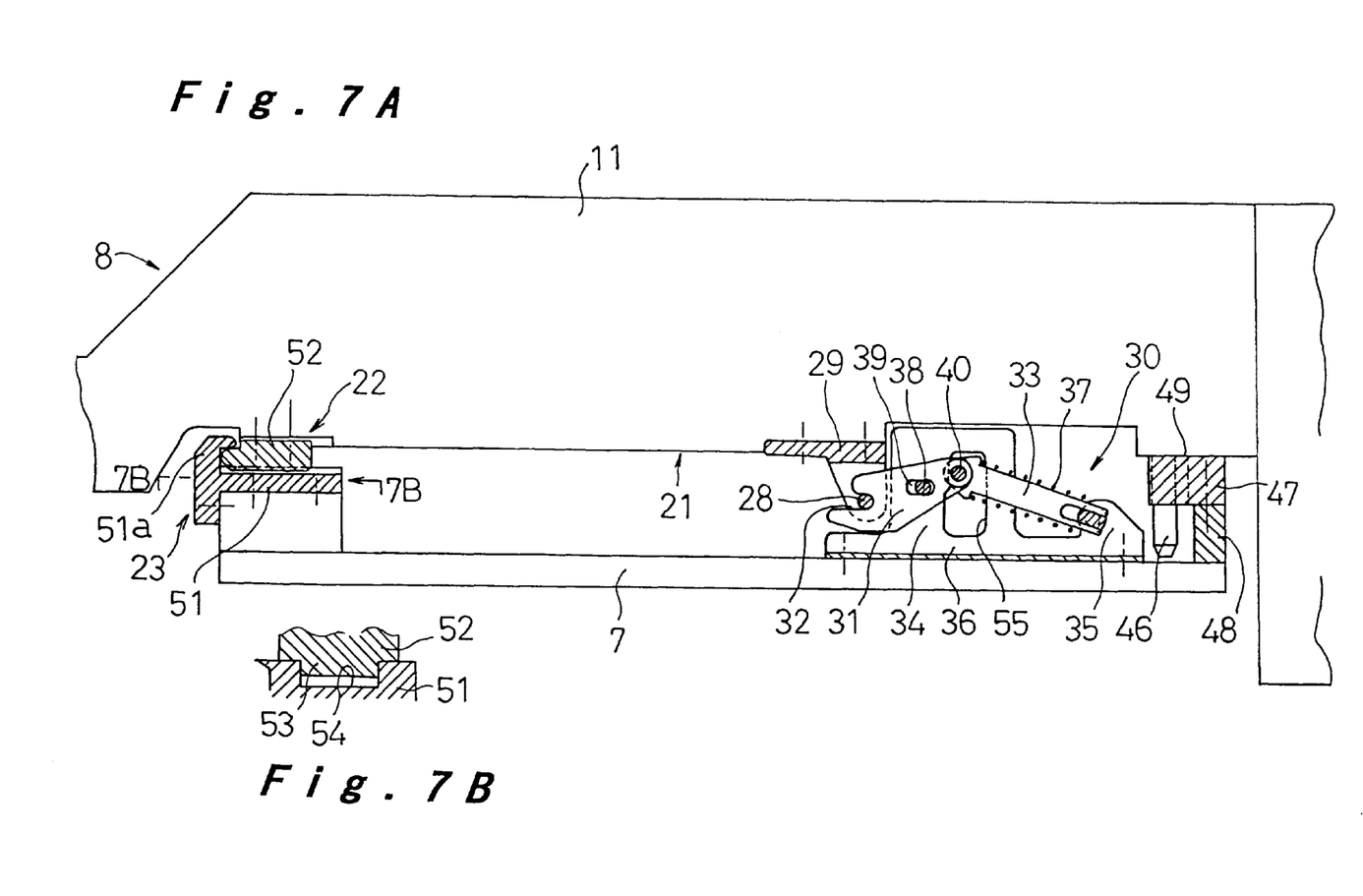
FIG. 7A is a partially sectioned front view of the condition in which mounting is effected showing the construction of major parts in yet a further embodiment of a fixing device for a parts supply device according to the present invention.
FIG. 7B is a partial view seen in the direction of arrows 7B—7B of FIG. 7A.
Figure 8:
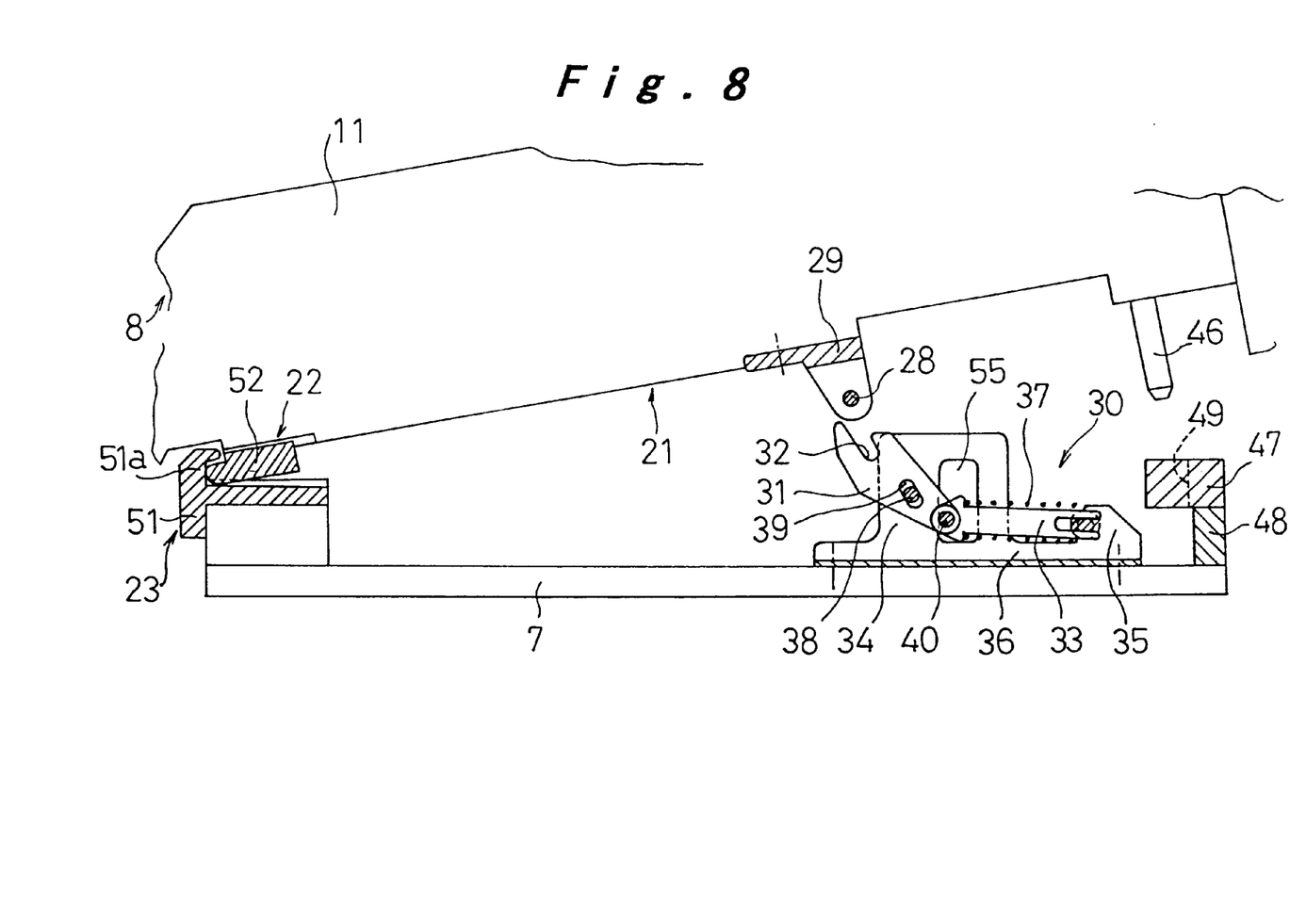
FIG. 8 is a partially sectioned front view showing the condition immediately prior to such mounting according to this embodiment.

Next, yet a further embodiment of a fixing device for a parts supply device according to the present invention will be described with reference to FIG. 7 and FIG. 8. Structural elements which are identical with those of the embodiments described above are given the same reference numerals and further description is omitted, only points of difference being described.

In this embodiment, abutment part 23 on the side of parts supply table 7 is constituted by a hook member 51 provided with an upwardly directed hook part 51a, while engagement part 22 on the side of parts supply device 8 is constituted by an engagement member 52. The front end of engagement member 52 that engages with hook part 51a of hook member 51 is cut in tapered fashion such that this engagement member 52 can effect engagement in a smooth fashion even when in a slanting attitude. Also, this embodiment is constituted such that, in place of positional location pin 26 and engagement groove 27 in the foregoing embodiments, there are provided a forwardly/rearwardly projecting rib 53 and groove 54 that engage by mutual telescopic fitting, positional location in the left/right direction being effected by means of this engagement. It should be noted that, in this embodiment also, position locating pin 26 and engagement groove 27 of the embodiments described above could be adopted as the means for left/right positional location at the front end of installation part 21, or, contrariwise, projecting rib 53 and groove 54 could be adopted as means for positional location in the left/right direction in the above embodiments.

The toggle link mechanism type fixing means 30 at the rear end of installation part 21 is arranged such that the displacement biasing force of parts supply device 8 created by compression spring 37 is directed forwards so that engagement member 52 is pushed towards hook member 51, and such that abutment link 31 is positioned at the front side. The first shaft support part 34 that supports the intermediate part of abutment link 31 is constructed such that the front end of its upper edge faces the aperture edge of engagement groove 32 of abutment link 31 in an upwardly directed attitude and its rear end extends rearwardly further than the connecting part of operating link 33. 55 is an escape hole for the link pin 40 of abutment link 31 and operating link 33 provided on first shaft support part 34.

With the above construction, parts supply device 8 can be located and fixed in position by a "one-touch" operation with excellent ease of operation by directly pushing down the rear part of parts supply device 8, by engagement of the leading end of engagement member 52 with the hook part 51a of hook member 51 on displacement of the front part of parts supply device 8 slantingly downwards. Also, since the front end of the upper edge of first shaft support part 34 faces the aperture edge of engagement groove 32 of abutment link 31 in an upwardly directed attitude, and extends rearwardly, when this bracket 29 is displaced forwards, the risk of the toggle link mechanism being accidentally actuated by abutment of fixing shaft 28 with abutment link 31 before fitting into engagement groove 32 can be eliminated.

While preferred embodiments of the invention have been described using specific terms, such description is for illustrative purposes only, and it is to be understood that changes and variations may be made without departing from the spirit or scope of the following claims.

What is claimed is:

1. A fixing device for removably locking a parts supply device to a parts supply table comprising:

an engagement part provided at a first end side of the parts supply device;

an abutment part provided on the side of the parts supply table that is fixed by engagement with the engagement part;

a fixing shaft provided at a second end side of the parts supply device; and a toggle link mechanism fixing unit provided on the parts supply table including an abutment link that is movably mounted with a cantilevered end having an engagement groove to engage the fixing shaft, the abutment link is biased towards two positions, a first position in which the engagement groove is directed upward and a second position in which the engagement groove is either horizontal or directed downward, the abutment link having a slot and a shaft extends through the slot to permit movement of the abutment link and means for biasing the abutment link so that the engagement part is pressed into the abutment part when the parts supply device is removably locked to the parts supply table.

2. A fixing device for removably locking a parts supply device to a parts supply table comprising:

an engagement part provided at a first end side of the parts supply device;

an abutment part provided on the side of the parts supply table that is fixed by engagement with the engagement part;

a fixing shaft provided at a second end side of the parts supply device; and a toggle link mechanism fixing unit provided on the parts supply table including an abutment link that is movably mounted with a cantilevered end having an engagement groove to engage the fixing shaft, the abutment link is biased towards two positions, a first position in which the engagement groove is directed upward and a second position in which the engagement groove is either horizontal or directed downward, an operating link is pivotally connected to the abutment link, a bracket having a first shaft support part that supports an intermediate part of the abutment link and a second shaft support part that slidably supports the operating link and a compression spring is interposed between the operating link and the second shaft support part.

3. A fixing device for removably locking a parts supply device to a parts supply table comprising:

an engagement part provided at a first end side of the parts supply device;

an abutment part provided on the side of the parts supply table that is fixed by engagement with the engagement part;

a fixing shaft provided at a second end side of the parts supply device;

a toggle link mechanism fixing unit provided on the parts supply table including an abutment link that is movably mounted with a cantilevered end having an engagement groove to engage the fixing shaft, the abutment link is biased towards two positions, a first position in which the engagement groove is directed upward and a second position in which the engagement groove is either horizontal or directed downward;

a restraining pin is provided on the parts supply table; and position locating part which engages the restraining pin is provided on the parts supply table.

4. The fixing device for a parts supply device according to claim 3, wherein the restraining pin is of a length such that engagement of the restraining pin with the position locating part is commenced before the fixing shaft fits into the engagement groove of the abutment link.

5. The fixing device for a parts supply device according to claim 4, wherein the position locating part is formed such that at least a root end and a tip of the restraining pin engage therewith.

6. A fixing device for removably locking a parts supply device to a parts supply table comprising:

an engagement part provided at a first end side of the parts supply device;

an abutment part provided on the side of the parts supply table that is fixed by engagement with the engagement part;

a fixing shaft provided at a second end side of the parts supply device; and a toggle link mechanism fixing unit provided on the parts supply table including an abutment link that is movably mounted with a cantilevered end having an engagement groove to engage the fixing shaft, the abutment link is biased towards two positions, a first position in which the engagement groove is directed upward and a second position in which the engagement groove is either horizontal or directed downward, wherein the abutment part includes an engagement plate with a tapered or arcuate leading end cross-section, and the engagement part includes a hook member and a position locating pin projects from one of the abutment part and the hook member, an engagement groove with which the position locating pin engages being formed in the other one.

7. A fixing device for removably locking a parts supply device to a parts supply table comprising:

an engagement part provided at a first end side of the parts supply device;

an abutment part provided on the side of the parts supply table that is fixed by engagement with the engagement part;

a fixing shaft provided at a second end side of the parts supply device; and a toggle link mechanism fixing unit provided on the parts supply table including an abutment link that is movably mounted with a cantilevered end having an engagement groove to engage the fixing shaft, the abutment link is biased towards two positions, a first position in which the engagement groove is directed upward and a second position in which the engagement groove is either horizontal or directed downward, wherein the abutment part includes an engagement plate with a tapered or arcuate leading end cross-section, and the engagement part includes a hook member wherein a rib is provided on one of the engagement plate and hook member, a groove that fits into said rib being formed in the other one.

8. A fixing device for removably locking a parts supply device to a parts supply table comprising:

an engagement part provided at a first end side of the parts supply device;

an abutment part provided on the side of the parts supply table that is fixed by engagement with the engagement part;

a fixing shaft provided at a second end side of the parts supply device; and a toggle link mechanism fixing unit provided on the parts supply table including an abutment link that is movably mounted with a cantilevered end having an engagement groove to engage the fixing shaft, the abutment link is biased towards two positions, a first position in which the engagement groove is directed upward and a second position in which the engagement groove is either horizontal or directed downward, wherein the abutment part on the parts supply table side includes a hook member provided with an upwardly directed hook part, the engagement part on the parts supply device includes an engagement member formed with a tapered or arcuate leading end cross-section, and the abutment link is arranged at a front side of the toggle link mechanism fixing unit, a first shaft support part supports an intermediate part of the abutment link, a front end of an upper edge thereof faces an aperture edge of the engagement groove of the abutment link when in an upwardly directed attitude, and a rear end thereof extends further rearwards than the rear end of the abutment link.

9. A fixing device for removably locking a parts supply device to a parts supply table comprising:

an engagement part provided at a first end side of the parts supply device;

an abutment part provided on the side of the parts supply table that is fixed by engagement with the engagement part;

a fixing shaft provided at a second end side of the parts supply device; and a toggle link mechanism fixing unit provided on the parts supply table including an abutment link that is movably mounted with a cantilevered end having an engagement groove to engage the fixing shaft, the abutment link is biased towards two positions, a first position in which the engagement groove is directed upward and a second position in which the engagement groove is either horizontal or directed downward, wherein the abutment part on the parts supply table side includes a hook member provided with an upwardly directed hook part, the engagement part on the parts supply device includes an engagement member formed with a tapered or arcuate leading end cross-section, and the abutment link is arranged at a front side of the toggle link mechanism fixing unit, a position locating pin projects from one of the hook member and engagement member, a second engagement groove with which the position locating pin engages being formed in the other one.

10. A fixing device for removably locking a parts supply device to a parts supply table comprising:

an engagement part provided at a first end side of the parts supply device;

an abutment part provided on the side of the parts supply table that is fixed by engagement with the engagement part;

a fixing shaft provided at a second end side of the parts supply device; and a toggle link mechanism fixing unit provided on the parts supply table including an abutment link that is movably mounted with a cantilevered end having an engagement groove to engage the fixing shaft, the abutment link is biased towards two positions, a first position in which the engagement groove is directed upward and a second position in which the engagement groove is either horizontal or directed downward, wherein the abutment part on the parts supply table side includes a hook member provided with an upwardly directed hook part, the engagement part on the parts supply device includes an engagement member formed with a tapered or arcuate leading end cross-section, and the abutment link is arranged at a front side of the toggle link mechanism fixing unit wherein a rib is provided on one of the hook member and the engagement member, and a groove that fits into said rib being formed in the other one.

11. A fixing device for removably locking a parts supply device to a parts supply table comprising:

an engagement part provided at a first end side of the parts supply device;

an abutment part provided on the side of the parts supply table that is fixed by engagement with the engagement part;

a fixing shaft provided at a second end side of the parts supply device; and a toggle link mechanism fixing unit provided on the parts supply table including an abutment link that is movably mounted with a cantilevered end having an engagement groove to engage the fixing shaft, the abutment link is biased towards two positions, a first position in which the engagement groove is directed upward and a second position in which the engagement groove is either horizontal or directed downward, wherein the cantilevered end of the abutment link is formed with the engagement groove and a shaft support part supports the abutment link, the engagement groove is smaller in thickness than the plate thickness of the shaft support part.

* * * * *